United States Patent [19]
Nakamura

[11] Patent Number: 6,140,840
[45] Date of Patent: Oct. 31, 2000

[54] MACRO CELL SIGNAL SELECTOR AND SEMICONDUCTOR INTEGRATED CIRCUIT INCLUDING THESE PARTS

[75] Inventor: Yoshiyuki Nakamura, Tokyo, Japan

[73] Assignee: NEC Corporation, Tokyo, Japan

[21] Appl. No.: 09/110,402

[22] Filed: Jul. 6, 1998

[30] Foreign Application Priority Data

Jul. 3, 1997 [JP] Japan ..................................... 9-177938

[51] Int. Cl.[7] ......................... H03K 19/177; G01R 31/28
[52] U.S. Cl. ................................ 326/40; 326/16; 714/725
[58] Field of Search ................................ 326/37–39, 41, 326/44, 47, 16, 82; 714/725, 738

[56] References Cited

U.S. PATENT DOCUMENTS

| | | | |
|---|---|---|---|
| 4,857,773 | 8/1989 | Takata et al. ............................. | 326/16 |
| 5,331,571 | 7/1994 | Aronoff et al. ..................... | 395/500.05 |
| 5,717,699 | 2/1998 | Haag et al. ............................. | 714/725 |
| 5,767,701 | 6/1998 | Choy et al. ................................ | 326/93 |

FOREIGN PATENT DOCUMENTS

| | | | |
|---|---|---|---|
| 2-111061 | 4/1990 | Japan ....................................... | 326/40 |
| 3-269377 | 11/1991 | Japan ....................................... | 326/40 |
| 4-278483 | 10/1992 | Japan ....................................... | 326/40 |

*Primary Examiner*—Michael Tokar
*Assistant Examiner*—James H Cho
*Attorney, Agent, or Firm*—Sughrue, Mion, Zinn Macpeak & Seas, PLLC

[57] ABSTRACT

A macro cell, a signal selector and a semiconductor integrated circuit including these parts. In a large scale integrated circuit including a built-in macro cell with two-way terminals, a testing of a single macro cell can be readily carried out in a production testing, and a signal communication between the macro cell and an external terminal can be executed in a normal operation. A designing of the large scale integrated circuit can be performed in a simple, flexible and systematic manner. A macro cell includes a two-way test exclusive terminal, a two-way user exclusive terminal, and a controller for actuating or unactuating these terminals in the testing and the normal operation. A signal selector includes two-way terminal to be connected to the test exclusive terminal of the macro cell, a macro cell connection exclusive terminal, and a controller to connect the these terminals to external terminals. The connection between the macro cell terminals and the signal selector terminals is controlled by a tmode signal.

5 Claims, 4 Drawing Sheets

MACRO CELL SIGNAL SELECTOR AND SEMICONDUCTOR INTEGRATED CIRCUIT INCLUDING THESE PARTS

BACKGROUND OF THE INVENTION

The present invention relates to a macro cell, a signal selector and a semiconductor integrated circuit of a signal control processing including developed existing circuit blocks as micro cells.

DESCRIPTION OF THE RELATED ART

In order to design a large scale logic integrated circuit, existing circuit blocks developed already as macro cells are adopted in a new developing integrated circuit with the result of reducing design manpower and a developing period. This technique can reduce a part of circuit design and shorten a developing period. Especially, this technique has been often used in a new ASIC (application specific integrated circuit) developing.

More specifically, an ASIC developer (called "user" later) uses already developed general-purpose integrated circuit whole as a micro cell and attaches an original additional circuit (called "user circuit" later) to the general-purpose integrated circuit to develop a new ASIC having an original function. The user further uses this developed ASIC as a macro cell to develop a further new large scale ASIC by attaching another original function.

In such a case in which the existing integrated circuit is used as a macro cell, an input-output interface buffer is removed from the existing integrated circuit, and the remaining internal circuit is used again in most cases. This internal circuit is called a "macro core" hereinafter.

The reasons why the ASIC technique can reduce the developing period are, besides the reduction of the circuit design manpower by using the existing circuit again, that regarding the used micro core, a test pattern obtained at the time when its original LSI (large scale integrated circuit) is checked can be used again when the produced ASIC is examined, and the design manpower of the test pattern can be saved.

In this case, a separation test circuit capable of checking a single built-in micro core separated from another circuit is required when the integrated circuit developed by the above-described technique is examined. In other words, at the examination, a separation test circuit is required, which enables the user to carry out a direct data communication between a terminal of each macro core built in the ASIC and an external terminal of the ASIC, to supply a test pattern to the micro core from the external terminal, and to output its result.

In general, a macro core is provided with an input terminal, an output terminal and a two-way (input-output) terminal. The present invention concerns particularly a separation test circuit of a two-way terminal of a macro core. For example, one separation test circuit of this kind is disclosed in Japanese Patent Laid-Open Publication No. 4-278483, Takashi YAMAGUCHI, as shown in FIG. 1.

In this conventional separation test circuit, as shown in FIG. 1, a chip select CS is made low (L) in level and a selector 22 connects a two-way terminal D of a macro cell 11 to an external two-way terminal 31 at a testing time. On the other hand, at a usual operation time, the chip select CS is made high (H) and the selector 22 connects the two-way terminal D of the macro cell 11 to a two-way terminal of a user circuit 12. A signal 34 selects either an input mode or an output mode of a two-way buffer 33.

In the conventional separation test circuit, in the testing, the two-way terminal D of the macro cell 11 is connected to the external two-way terminal 31 so as to communicate a signal between the macro cell 11 and the outside of the LSI directly. On the other hand, in the normal operation, the two-way terminal D of the macro cell 11 is connected to the two-way terminal of the user circuit 12 so as to communicate a signal between the macro cell 11 and the user circuit 12. However, two two-way separation buffers 33 are inserted between the macro cell 11 and the external two-way terminal 31 or the user circuit 12, and two input and output lines connect the two two-way separation buffers 33.

In the conventional separation test circuit, as described above, in spite of the fact that one two-way line connects between the two-way terminal of the macro cell or the user circuit and the two-way separation buffer, the separated two input and output lines connect between the two two-way separation buffers. As a result, the wiring number within the test circuit increases, and the entire area of the chip increases.

Moreover, although there is no mention in the conventional case, in the normal operation, a two-way signal communication is required not only between the macro cell and the external terminal but also between the user circuit and the external terminal, and a particular signal controller for controlling this is also required to be built in.

The user is required to properly design the separation test circuit and the signal controller depending on functions of an ASIC to be developed. However, so far, as described above, it is necessary to consider not only the signal controller capable of carrying out the desired signal control between the external terminal and the macro cell or the user circuit in the normal operation mode but also the separation test circuit capable of cutting out only the selected macro cell and connecting the selected macro cell to the external terminal in the testing mode. There is no device to enable the ASIC user to design a signal control system systematically in a simple manner.

SUMMARY OF THE INVENTION

It is therefore an object of the present invention to provide a macro cell in view of the aforementioned disadvantages of the prior art, which is capable of controlling a signal communication between the macro cell and outside in both a normal operation and a testing in a simple, flexible and systematic manner, and designing a signal control system in a simple, flexible and systematic manner.

It is another object of the present invention to provide a signal selector which is capable of controlling a signal communication between the macro cell and outside in both a normal operation and a testing in a simple, flexible and systematic manner, and designing a signal control system in a simple, flexible and systematic manner.

It is a further object of the present invention to provide a semiconductor integrated circuit in view of the aforementioned disadvantages of the prior art, which is capable of controlling a signal communication between the macro cell and outside and between a signal selector and the outside in both a normal operation and a testing in a simple, flexible and systematic manner, designing a signal control system in a simple, flexible and systematic manner, and simplifying a wiring circuit to enable a wiring circuit designing exactly in a short time and to reduce a wiring area.

In accordance with one aspect of the present invention, there is provided a macro cell having a two-way data internal terminal, comprising a first two-way data external terminal connected to the two-way data internal terminal; and a second two-way data external terminal connected to the two-way data internal terminal.

A macro cell of the present invention further comprises two-way buffers between the two-way data internal terminal and the first and second two-way data external terminals.

A macro cell of the present invention further comprises a two-way mode selection signal internal terminal;

a first two-way mode selection signal external terminal connected to the two-way mode selection signal internal terminal; and a second two-way mode selection signal external terminal connected to the two-way mode selection signal internal terminal.

A macro cell of the present invention preferably further comprises a first controller which actuates the two-way buffer connected to the first two-way data external terminal and outputs a signal of the two-way mode selection signal internal terminal to the first two-way mode selection signal external terminal when a first control signal is input from outside and is at a first logic level, and which unactuates the two-way buffer connected to the first two-way data external terminal and prevents the signal of the two-way mode selection signal internal terminal from supplying to the first two-way mode selection signal external terminal when the first control signal is at a second logic level.

A macro cell of the present invention preferably further comprises a second controller which actuates the two-way buffer connected to the second two-way data external terminal and outputs the signal of the two-way mode selection signal internal terminal to the second two-way mode selection signal external terminal when a second control signal is input from outside and is at a first logic level and the first control signal is at the second logic level, and which unactuates the two-way buffer connected to the second two-way data external terminal and prevents the signal of the two-way mode selection signal internal terminal from supplying to the second two-way mode selection signal external terminal when the first control signal is at the second logic level and the second control signal is at a second logic level.

A signal selector of the present invention comprises first, second and third two-way data terminals; and first, second and third two-way mode selection signal terminals. The signal selector connects the first two-way data terminal to the third two-way data terminal and connects the first two-way mode selection signal terminal to the third two-way mode selection signal terminal when a control signal input from outside is at a first logic level. The signal selector connects the second two-way data terminal to the third two-way data terminal and connects the second two-way mode selection signal terminal to the third two-way mode selection signal terminal when the control signal is at a second logic level.

In accordance with another aspect of the present invention, there is provided a semiconductor integrated circuit, comprising a macro cell described above;

a signal selector described above; and a user circuit having a two-way data terminal and a two-way mode selection signal terminal, the macro cell, the signal selector and the user circuit constituting a large scale integrated circuit, the first two-way data external terminal and the first two-way mode selection signal external terminal of the macro cell being connected to the two-way data terminal and the two-way mode selection signal terminal of the user circuit, respectively, the second two-way data external terminal and the second two-way mode selection signal external terminal of the macro cell being connected to the second two-way data terminal and the second two-way mode selection signal terminal of the signal selector, respectively, the first two-way data terminal and the first two-way mode selection signal terminal of the signal selector being connected to the two-way data terminal and the two-way mode selection signal terminal of the user circuit, respectively, the large scale integrated circuit inputting a test mode signal as the first control signal to be supplied to the macro cell and the signal selector and inputting a macro cell selection signal as the second control signal to be supplied to the macro cell, carrying out a data communication between the two-way data terminal of the user circuit and outside of the large scale integrated circuit via the signal selector when the test mode signal is at the first logic level, carrying out the data communication between the second two-way data external terminal of the macro cell and the outside of the large scale integrated circuit via the signal selector when the test mode signal is at the second logic level and the macro cell selection signal is at the first logic level. The second two-way data external terminal of the macro cell is prevented from communicating data with the outside when the test mode signal is at the second logic level and the macro cell selection signal is at the second logic level.

A semiconductor integrated circuit of the present invention preferably comprises a plurality of macro cells, each having a plurality of two-way external terminals and a two-way signal terminal; and a signal controller for mutually connecting the plurality of two-way external terminals and the two-way signal terminals of the plurality of macro cells, each macro cell including a test exclusive terminal as the two-way signal terminal and a user exclusive terminal and capable of communicating with outside not only via the user exclusive terminal in a normal operation mode but also via the test exclusive terminal in a testing mode, the signal controller including a user exclusive terminal and a test exclusive terminal, transferring not only a signal connected to the user exclusive terminal to the outside in the normal operation mode but also a signal connected to the text exclusive terminal to the outside in the testing mode, connecting the user exclusive terminal of the macro cell to the user exclusive terminal of the signal controller, and connecting the test exclusive terminal of the macro cell to the test exclusive terminal of the signal controller.

According to the present invention, by using the macro cell and the selector, in the normal operation, the designing of the control system capable of performing a two-way signal or data communication between the external terminal and the macro cell or the user circuit in a simple and flexible manner can be readily carried out. Moreover, in the production testing, with only the tmode signal and the sel signal, only the desired macro cell can be isolated freely from the whole circuit, settling a testing environment.

Further, two of the macro cell, the selector, the user circuit and the outside of the system are connected by one line via two-way terminals attached to these members so that the two-way signal or data communication may be carried out between the two members, and the wiring area can be reduced.

In the ASIC of the present invention, the macro cell is provided with the test exclusive terminals and the user exclusive terminals as the two-way data terminals so as to communicate with outside of the whole circuit not only via the user exclusive terminals in the normal operation but only via the test exclusive terminals in the testing. Further, each selector for controlling the signals between the macro cell and the external terminal also includes the user exclusive terminals and the test exclusive terminals, and so as to carry out the signal communication with the outside of the whole circuit not only via the user exclusive terminals in the normal operation but only via the test exclusive terminals in the testing.

In the present invention, when an ASIC is designed using a macro cell and a selector, all a designer must do is connecting another circuit to user exclusive terminals of the macro cell, connecting an external terminal to test exclusive terminals of the macro cell, connecting a two-way signal of a user circuit to be output to user terminals of the selector in a normal operation, and connecting the test exclusive terminal of the macro cell to the test exclusive terminals of the selector, and a two-way signal control can be performed in both the normal operation and the testing in a simple, flexible and systematic manner.

Hence, a designing of the ASIC can be carried out in a simple, flexible and systematic manner, and even when a large number of circuit blocks are used, a wiring designing between the blocks can be exactly carried out in a short period without any failure.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 1:
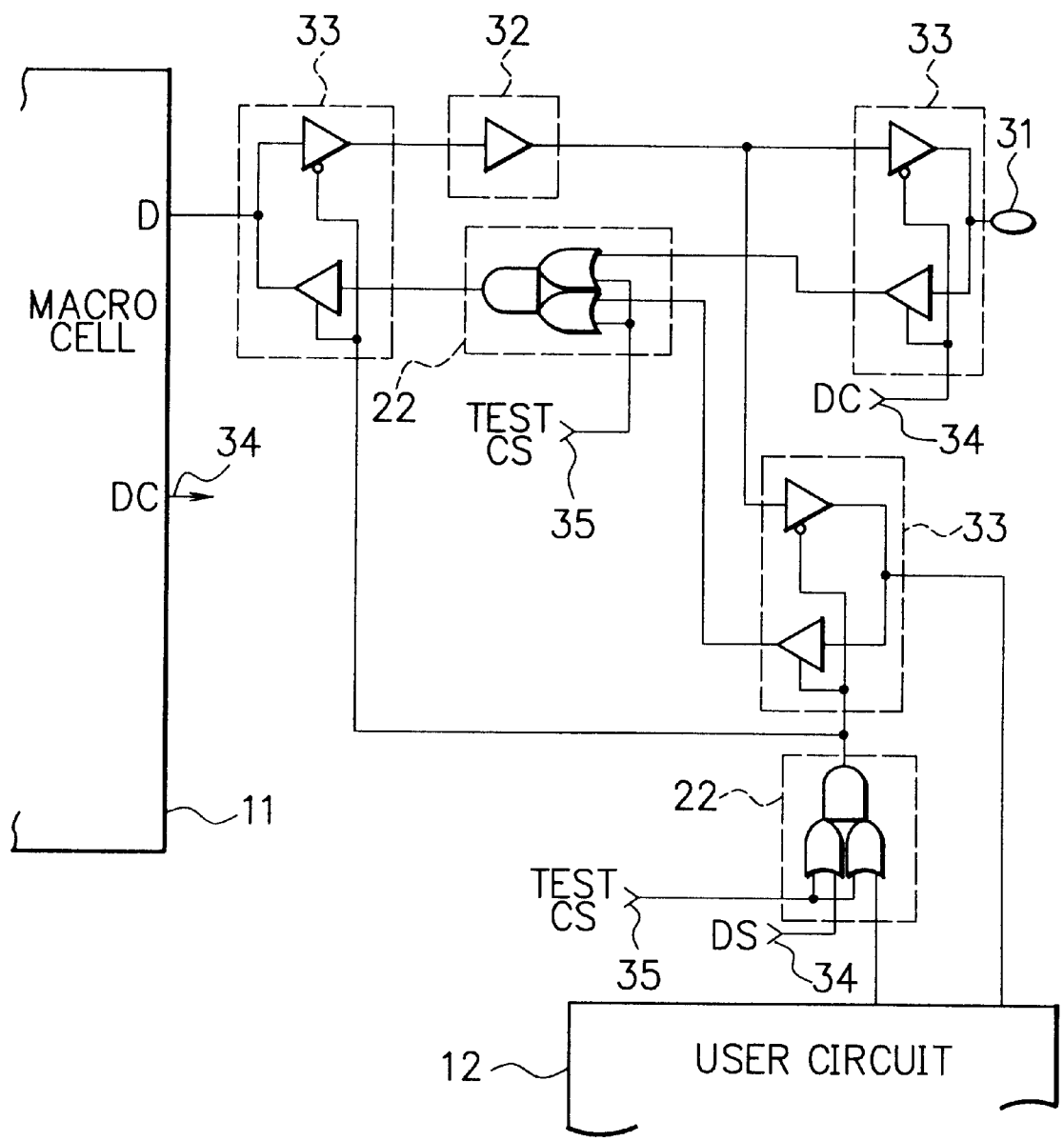
FIG. 1 is a block diagram of a conventional separation test circuit.
Figure 2:
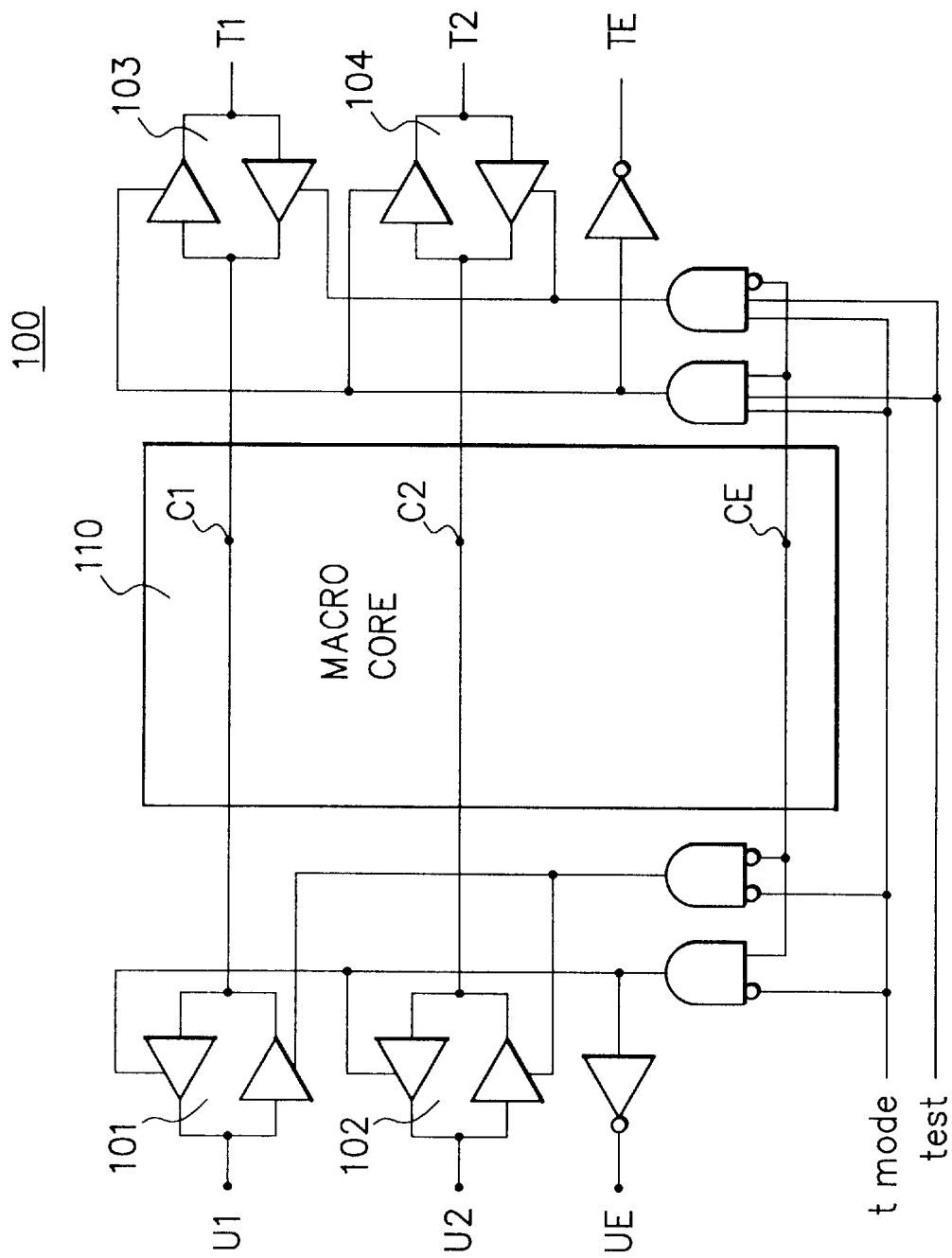
FIG. 2 is a block diagram of a macro cell according to one embodiment of the present invention.

Referring now to the drawings, there is shown in FIG. 2 a macro cell according to one embodiment of the present invention.

In FIG. 2, the macro cell 100 comprises a macro core 110 and four two-way buffers 101 to 104. The macro core is an internal functional circuit obtained by removing interface buffers from an existing LSI (large scale integrated circuit). The macro core 110 includes two-way core terminals C1 and C2 and a selection signal core terminal CE for outputting a mode selection signal for selecting an input mode or an output mode of the two-way buffers 101 to 104. Two two-way user terminals U1 and U2 connected to the respective two-way buffers 101 and 102 are to be coupled with user circuits (not shown). A selection signal user terminal UE outputs the mode selection signal. Two two-way test terminals T1 and T2 connected to the respective two-way buffers 103 and 104 are to be linked to outside of the macro cell 100. A two-way mode selection signal test terminal TE outputs the mode selection signal.

In FIG. 2, "tmode" represents a mode selection signal for selecting a testing mode or a normal operation mode, and "test" represents a test macro cell selection signal for selecting a macro cell to be tested in the testing mode. The tmode signal and the test signal are control signals supplied from outside of the macro cell 100.

In this embodiment, tmode=0 shows the normal operation mode. When tmode=0, the two two-way buffers 101 and 102 located on the user terminal side (not shown in FIG. 3) are actuated, and a mode selection signal for selecting an input mode or an output mode is transferred from the two-way mode selection signal core terminal CE to the selection signal user terminal UE. On the other hand, tmode=1 shows the testing mode. When tmode=1, a high (H) level signal as the test signal is input, and the two two-way buffers 103 and 104 located on the test terminal side are actuated. At the same time, the mode selection signal is transferred from the two-way mode selection signal core terminal CE to the selection signal test terminal TE.

As described above, in the macro cell according to the present invention, the test terminals Ti and the user terminals Ui corresponding to the two-way core terminals Ci are arranged. In this embodiment, although two two-way terminals and one two-way mode selection signal terminal are shown, it is clear that the numbers of these terminals are not restricted to these numbers and any numbers can be selected.

Figure 3:
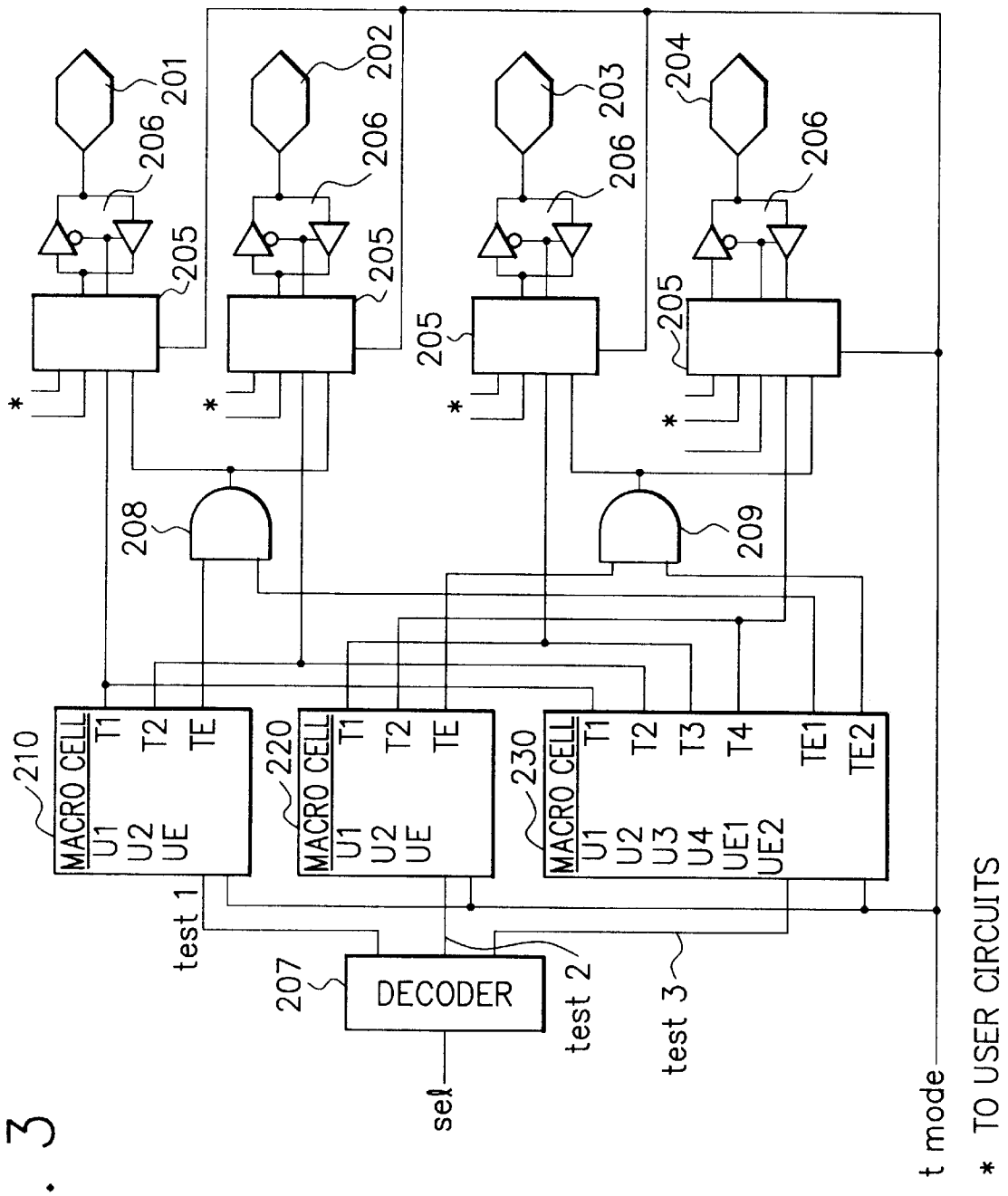
FIG. 3 is a block diagram of an ASIC including a plurality of macro cells shown in FIG. 2 according to one embodiment of the present invention.

FIG. 3 illustrates an ASIC including a plurality of macro cells shown in FIG. 2 according to one embodiment of the present invention.

In FIG. 3, the ASIC comprises three macro cells 210, 220 and 230, four external terminals 201 to 204, four two-way interface buffers 206 connected to the respective external terminals 201 to 204, four selectors 205 for connecting either the test terminal or the user terminal of the macro cell 210, 220 or 230 to the respective two-way interface buffers 206, a decoder 207 for generating a test signal test1, test2 or test3 for selecting the respective macro cell 210, 220 or 230 in the testing mode, and two AND gates 208 and 209. A selection signal sel and the tmode signal are supplied from outside of the ASIC.

In this embodiment, the user terminals Ui and the mode selection signal user terminals UEi of the macro cells 210 to 230 are connected to user circuits (not shown) within the ASIC. A plurality of user circuits can be provided, and in such a case, the macro cells are connected to the respective user circuits.

Figure 4:
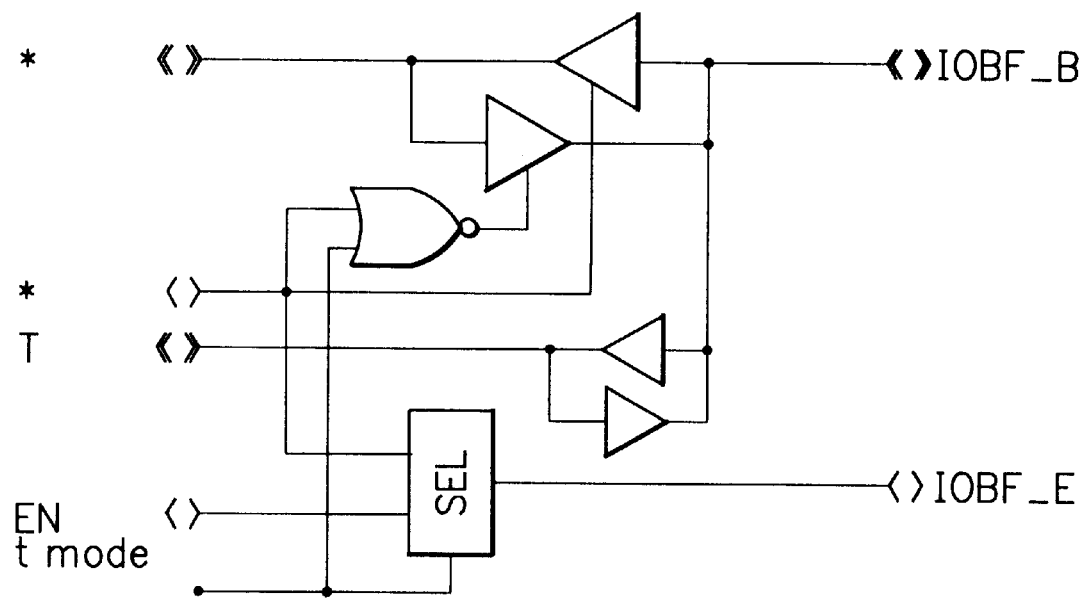
FIG. 4 is a block diagram of a signal selector shown in FIG. 3.

FIG. 4 shows a signal selector 205 shown in FIG. 3 wherein << >> represents a two-way data terminal, < > represents a control signal terminal of the selector, and * and T attached to the terminals << >> and < > represent that these terminals are to be connected to the two-way data terminals and the two-way mode selection signal terminals of the respective user circuits and to the test terminals of the respective macro cells. Further, terminals attached with EN and tmode are to be connected to the outputs of the AND gates 208 and 209 and the tmode, respectively, shown in FIG. 3. Moreover, a two-way output terminal IOBF-B and a two-way mode selection signal terminal IOBF-E are to be coupled with a two-way data terminal and a two-way mode selection signal terminal of the respective two-way interface buffer 206 shown in FIG. 3.

Then, an operation of the selector 205 will be described. First, when tmode=0, the two-way data terminal and the two-way mode selection signal terminal of the respective user circuit are connected to the terminals IOBF-B and IOBF-E, respectively. On the other hand, when tmode=1, the two-way data terminal of the macro cell and a two-way mode selection signal EN are connected to the terminals IOBF-B and IOBF-E, respectively.

Next, the operation of the ASIC shown in FIG. 3 will be described in detail.

First, when tmode=0, in the normal operation mode, the two-way buffers located on the user terminal side of the macro cell are actuated, while the selector 205 connects the two-way data terminals and the two-way mode selection signal terminal of the macro cell to the terminals of the respective interface buffer 206. Thus, the two-way signal or data communication can be carried out between the user circuit and the outside of the ASIC via the external terminal 201, 202, 203 or 204, and between the user circuit and the macro cell as well.

In the macro cell whose user terminals are directly connected to the user circuit terminals of the selector, the two-way signal or data communication can be executed between the macro cell and the external terminal. In this case, a wiring circuit for connecting the user terminals of the macro cell to the user circuit two-way terminals of the selector shall be considered as a user circuit.

As described above, with the use of the macro cell and the selector of the present invention, in the normal operation, a designing of a control system capable of carrying out a two-way signal or data communication between the external terminal and the macro cell or the user circuit depending on purposes can be readily implemented.

Next, when tmode=1, in the testing, the decoder 207 interprets the input sel signal and activates one macro cell section signal test1, test2 or test3 to output the activated signal to the respective macro cell 210, 220 or 230. In the selected macro cell, the two-way buffers located on the test terminal side are actuated, while the two-way buffers located on the user terminal side are unactuated. As to the unselected macro cells, the two-way buffers located on the test terminal side and the user terminal side are both unactuated, and they are thus separated from the whole circuit.

Simultaneously, in the selector 205, the test terminal of the macro cell is connected to the two-way output terminal IOBF-B of the selector, and the two-way mode selection signal EN from the macro cell is to the two-way mode selection signal terminal IOBF-E of the selector.

Hence, only the selected macro cell is connected to the outside via the external terminal 201, 202, 203 or 204, and a test pattern is input to the macro cell via the external terminal. Thus, the macro cell outputs the signal corresponding to the test pattern.

As described above, by using the macro cell and the selector of the present invention, in the normal operation, the designing of the control system capable of performing a two-way signal or data communication between the external terminal and the macro cell or the user circuit in a simple and flexible manner can be readily carried out. Moreover, in the production testing, with only the tmode signal and the sel signal, only the desired macro cell can be isolated freely from the whole circuit, settling a testing environment.

Furthermore, in this embodiment, two of the macro cell, the selector, the user circuit and the outside of the system are connected by one line via two-way terminals attached to these members so that the two-way signal or data communication may be carried out between the two members, and the wiring area can be reduced.

In the aforementioned macro cell of the present invention, as shown in FIG. 2, although the two-way buffers located on both the test terminal side and the user terminal side and the controllers for actuating or unactuating the two-way buffers are built in the macro cell, the two-way buffers and the controllers may be excluded out of the macro cell, and the macro core and the two-way test and user terminals attached thereto may be considered to be a macro cell. It is apparent from a circuit standpoint that the latter macro cell is essentially the same as the former and thus its function is the same. However, the two-way buffers and the controllers may be preferably included in the macro cell from a viewpoint of an ASIC, and this enables the user to ensure an easier designing.

Although the present invention has been described focusing on the ASIC, it is readily understood that the present invention can be effectively applicable when an existing macro cell or cells is combined with a newly designed circuit block to develop a further large scale integrated circuit (LSI) or only the existing macro cells are combined with one another to develop a further large scale integrated circuit.

According to the present invention, as described above, in the ASIC, the macro cell is provided with the test exclusive terminals and the user exclusive terminals as the two-way data terminals so as to communicate with outside of the whole circuit not only via the user exclusive terminals in the normal operation but only via the test exclusive terminals in the testing. Further, each selector for controlling the signals between the macro cell and the external terminal also includes the user exclusive terminals and the test exclusive terminals, and so as to carry out the signal communication with the outside of the whole circuit not only via the user exclusive terminals in the normal operation but only via the test exclusive terminals in the testing. Hence, a control of a signal communication can be implemented in a simple, flexible and systematic manner, and a designing of the ASIC can be carried out in a simple, flexible and systematic manner.

It is readily understood that, when an ASIC is designed using a macro cell and a selector, all a designer must do is connecting another circuit to user exclusive terminals of the macro cell, connecting an external terminal to test exclusive terminals of the macro cell, connecting a two-way signal of a user circuit to be output to user terminals of the selector in a normal operation, and connecting the test exclusive terminal of the macro cell to the test exclusive terminals of the selector, and a two-way signal control can be performed in both the normal operation and the testing in a simple, flexible and systematic manner.

Hence, even when a large number of circuit blocks are used, a wiring designing between the blocks can be exactly carried out in a short period without any failure.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor integrated circuit, comprising:
    a plurality of macro cells, each having a plurality of two-way external terminals and a two-way signal terminal; and
    a signal controller for mutually connecting the plurality of two-way external terminals and the two-way signal terminals of the plurality of macro cells,
    each macro cell including a test exclusive terminal as the two-way signal terminal and a user exclusive terminal and capable of communicating with outside not only via the user exclusive terminal in a normal operation mode but also via the test exclusive terminal in a testing mode, the signal controller including a user exclusive terminal and a test exclusive terminal, transferring not only a signal connected to the user exclusive terminal to the outside in the normal operation mode but also a signal connected to the text exclusive terminal to the outside in the testing mode, connecting the user exclusive terminal of the macro cell to the user exclusive terminal of the signal controller, and connecting the test exclusive terminal of the macro cell to the test exclusive terminal of the signal controller.

2. A macro cell having a two-way data internal terminal, comprising:

a first two-way data external terminal connected to said two-way data internal terminal;

a second two-way data external terminal connected to said two-way data internal terminal;

two way buffers between said two-way data internal terminals and said first and second two-way data external terminals;

a two-way mode selection signal internal terminal;

a first selection signal external terminal connected to said two-way mode selection signal internal terminal;

a second selection signal external terminal connected to said two-way mode selection signal internal terminal;

a first controller which actuates said two-way buffer connected to said first two-way data external terminal and outputs a signal of said two-way mode selection signal internal terminal to said first selection signal external terminal when a first control signal is input from outside and is at a first logic level, and which unactuates said two-way buffer connected to said first two-way data external terminal and prevents said signal of said two-way selection signal internal terminal from supplying to said first selection signal external terminal when said first control signal is at a second logic level.

3. A macro cell according to claim 2, further comprising:

a second controller which actuates said two-way buffer connected to said second two-way data external terminal and outputs a signal of said two-way mode selection signal external terminal when a second control signal is input from outside and is at said first logic level and said first control signal is at said second logic level, and which unactuates said two-way buffer connected to said two-way data external terminal and prevents said signal of the two-way mode selection signal internal terminal from supplying to said second selection signal external terminal when said first control signal is at said second logic level and said second control signal is at said second logic signal.

4. A semiconductor integrated circuit including the macro cell of claim 3 and further comprising:

a signal selector comprising,
first, second, and third two-way data terminals; and
first, second, and third two-way mode selection signal terminals;

said signal selector connecting said first two-way mode data terminal to said third two-way data terminal and connecting said first two-way mode selection signal terminal to said third two-way mode selection signal terminal when a control signal input from outside is at a first logic level, said signal selector connecting said second two-way data terminal to said third two-way data terminal and connecting said second two-way mode selection signal terminal to said third two-way mode selection signal terminal when said control signal is at a second logic level;

a user circuit having a two-way data terminal and a two-way mod selection signal terminal;

said macro cell, said signal selector, and said user circuit constituting a large scale integrated circuit;

said first two-way data external terminal and said first two-way mode selection signal external terminal of said macro cell being connected to said two-way data terminal and said two-way mode selection signal terminal of said user circuit, respectively, said second two-way data external terminal and said second two-way mode selection signal external terminal of said macro cell being connected to said second two-way data terminal and said second two-way mode selection signal terminal of said signal selector, respectively, said first two way data terminal and said first two-way mode selection signal terminal of said signal selector being connected to said two-way data terminal and said two-way mode selection signal terminal of said user circuit, respectively;

said large scale integrated circuit inputting a test mode signal as said first control signal to be supplied to said macro cell and said signal selector and inputting a macro cell selection signal as said second control signal to be supplied to said macro cell, carrying out a data communication between said two-way data terminal of said user circuit and outside of said large scale integrated circuit via said signal selector when said test mode signal is at siad first logic level, carrying out said data communication between said second two-way data external terminal of said macro cell and said outside of said large scale integrated circuit via said signal selector when said test mode signal is at said second logic level and said macro cell selection signal is at said first logic level.

5. A semiconductor integrated circuit of claim 4, wherein said second two-way data external terminal of said macro cell is prevented from communicating data with said outside when said test mode signal is at said second logic level and said macro cell selection signal is at said second logic level.

* * * * *